(12) United States Patent
Lee

(10) Patent No.: US 7,018,931 B2
(45) Date of Patent: Mar. 28, 2006

(54) METHOD OF FORMING AN ISOLATION FILM IN A SEMICONDUCTOR DEVICE

(75) Inventor: Sung Hoon Lee, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 238 days.

(21) Appl. No.: 10/631,238

(22) Filed: Jul. 31, 2003

(65) Prior Publication Data

US 2004/0092114 A1 May 13, 2004

(30) Foreign Application Priority Data

Nov. 7, 2002 (KR) ........................ 10-2002-0068678

(51) Int. Cl.
*H01L 21/302* (2006.01)
(52) U.S. Cl. .................. 438/706; 438/424; 438/710; 438/714
(58) Field of Classification Search ............... 438/424, 438/425, 431, 700, 706, 710, 714, 723
See application file for complete search history.

(56) References Cited

U.S. PATENT DOCUMENTS 5,937,309 A * 8/1999 Chuang .................. 438/424
5,942,803 A   8/1999 Shim et al.
6,214,747 B1  4/2001 Chou et al.
6,500,727 B1 * 12/2002 Chen et al. ............. 438/424
6,890,859 B1 * 5/2005 Bamnolker et al. ......... 438/700

OTHER PUBLICATIONS

Office Action from the Chinese Intellectual Property Office (4 pages).

* cited by examiner

*Primary Examiner*—Lan Vinh
(74) *Attorney, Agent, or Firm*—Marshall, Gerstein & Borun LLP

(57) ABSTRACT

Disclosed is a method of forming an isolation film in a semiconductor device. In the process of forming a stack structure of a pad oxide film and a pad nitride film that expose a semiconductor substrate in an isolation region, protrusions of a tail profile are formed at the bottom sidewalls of the pad nitride film and the pad oxide film adjacent to the surface of the substrate, and top corners of a trench are made rounded using the protrusions as an anti-etch film when the substrate is etched, Therefore, it is possible to prevent concentration of an electric field on the top corners of the trench and prohibit generation of the leakage current. Accordingly, reliability of the process and electrical characteristics of the device could be improved.

11 Claims, 4 Drawing Sheets

METHOD OF FORMING AN ISOLATION FILM IN A SEMICONDUCTOR DEVICE

BACKGROUND OF THE INVENTION

1. Technical Field

A method of forming an isolation film in a semiconductor device is disclosed which is capable of preventing concentration of an electric field on the top corners of the trench in the isolation film of a STI (shallow trench isolation) structure.

2. Background of the Related Art

In all of the semiconductor devices, the isolation films for electrically isolating various devices formed in the semiconductor substrate are formed. Conventionally, the isolation film is formed by means of LOCOS (local oxidation) process. In this case, however, a bird's beak occurs the corners of the isolation film. Due to this, there are problems that the electrical characteristics and degree of integration of the device are degraded.

As the degree of integration in the semiconductor device becomes higher, the isolation film is formed to have a STI (shallow trench isolation) structure that can minimize generation of the bird's beak at the isolation film while preventing generation of it.

A conventional method of forming the isolation film in the semiconductor device will be described by reference to FIG. 1A~FIG. 1D.

Referring to FIG. 1A, a pad oxide film 102 and a pad nitride film 103 are sequentially formed on a semiconductor substrate 101. A photoresist is then covered on the pad nitride film 103. Next, exposure and development processes are implemented to form a photoresist pattern 104 in which an isolation region where the isolation film will be formed is defined. Thereby, the pad nitride film 103 in the region where the isolation film is to be formed is exposed.

By reference to FIG. 1B, the pad nitride film 103 in the isolation region is removed through an etch process. The pad oxide film 102 exposed below is then sequentially removed. Thereby, the semiconductor substrate 101 in the isolation region is exposed.

Referring to FIG. 1C, the semiconductor substrate 101 in the isolation region is etched by a given depth to form a trench 105. Next, the photoresist pattern (104 in FIG. 1B) is removed.

By reference to FIG. 1D, an insulating material layer (not shown) is formed so that the trench 105 is buried. Next, the insulating material layer on the pad nitride film (103 in FIG. 1C) is removed by means of a chemical mechanical polishing process. Also, the pad nitride film and the pad oxide film (102 in FIG. 1C) are sequentially removed by means of an etch process. Thereby, the insulating material layer remains only in the trench to form an isolation film 106 consisting of the insulating material layer.

The isolation film formation method described above will be examined. In case that the isolation film is formed to have the STI structure, the bird's beak does not occur. Therefore, it is possible to prevent degradation in the electrical characteristics and the degree of integration due to the bird's beak.

However, the most vulnerability in the isolation film of the STI structure is that the electric field is concentrated on a portion where the top corners of the trench (105a in FIG. 1C) are sharp-pointed. If the top corners of the trench are thus pointed, a gate oxide film is thinly formed at this portion, which increases the leakage current at this portion. The electric field is concentrated on that portion, which may change the threshold voltage of the transistor and cause defect in the device. Therefore, there is a problem that reliability of the device is degraded.

A method of preventing this is one by which the photoresist pattern is used as an etch mask without using the pad nitride film as the etch mask when the substrate is etched to form the trench. This method will be described in detail.

In FIG. 1C, in the state that the photoresist pattern remains in tact on the pad nitride film 103 without removing the photoresist pattern, as in FIG. 1B, if a polymerization reaction is generated using an etchant upon etch of the substrate for forming the trench, polymer is accumulated on the substrate at the corners of the isolation region while polymer is generated. As a silicon component and an etch selectivity ratio are different in the accumulated polymer, the accumulated polymer serves as an anti-etch film when the substrate is etched. Due to this, the corners of the isolation region on which polymer is accumulated is rarely etched compared to the center of the isolation film. Therefore, the top corners of the trench are made rounded.

However, this method could not exactly control the amount of generation of polymer. It is thus difficult to uniformly form the top corners of the trench in a rounded shape. Furthermore, in case that the photoresist pattern is used as the etch mask, it becomes difficult to etch the semiconductor substrate due to polymer occurring in the photoresist as the pattern size is integrated. Accordingly, it is required that the semiconductor substrate be etched with the photoresist pattern removed. However, when the pad nitride film is used as the etch mask with the photoresist pattern removed, carbon source for generating polymer is short. Therefore, it is further difficult to make rounded the top corners of the trench using polymer.

SUMMARY OF THE DISCLOSURE

Accordingly, the techniques disclosed herein have been contrived to substantially obviate one or more problems due to limitations and disadvantages of the related art.

One disclosed method of forming an isolation film in a semiconductor device comprises, in the process of forming a stack structure of a pad oxide film and a pad nitride film that expose a semiconductor substrate in an isolation region, forming protrusions of a tail profile at the bottom sidewalls of the pad nitride film and the pad oxide film adjacent to the surface of the substrate and making rounded the top corners of a trench using the protrusions as an anti-etch film when the semiconductor substrate is etched, whereby concentration of an electric field on the top corners of the trench is prevented and generation of the leakage current is prohibited, thus improving reliability of the process and electrical characteristics of the device and simultaneously solving a difficult of the process for polymer since the top corners of the trench is made rounded even with the photoresist pattern removed.

Additional advantages and features will be set forth in part in the description which follows and in part will become apparent to those having ordinary skill in the art upon examination of the following or may be learned from practice of the invention. Other advantages may be realized and attained by the structure particularly pointed out in the written description and claims hereof as well as the appended drawings.

Another method of forming an isolation film in a semiconductor device according to a preferred embodiment is characterized in that it comprises the steps of sequentially forming a pad oxide film and a pad nitride film on a semiconductor substrate, removing the pad nitride film and the pad oxide film on an isolation region so that protrusions of a tail profile are formed at the top corners of the isolation region, etching the semiconductor substrate of the isolation region, while using the protrusions as an anti-etch film, to form a trench the top corners of which are made rounded, and burying the trench with an insulating material and then removing the pad nitride film and the pad oxide film on the semiconductor substrate to form an isolation film.

In the above, the protrusions may be formed by implementing an over-etch process using a $CHF_3$ gas during 1~10% of time taken to remove the pad nitride film after the pad nitride film in the isolation region is removed. Alternatively, the protrusions may be formed by implementing an etch process with a high selectivity ratio to oxide in the etch process for removing the pad nitride film and the pad oxide film. Meanwhile, the etch process is implemented using a $CF_4$ gas and a $CHF_3$ gas as an etch gas and wherein the $CHF_3$ gas is more supplied than the $CF_4$ gas so that the selectivity ratio to oxide is increased. At this time, it is possible to control the supply ratio of the $CHF_3$ gas and the $CF_4$ gas at the ratio of 2:1~10:1. This etch process is implementing by setting a time point when an oxide component of the pad oxide film is detected as an end of point (EOP).

Furthermore, a photoresist pattern is formed on the pad nitride film-in order to define the isolation region. At this time, the photoresist pattern is removed before the trench is formed after the pad nitride film and the pad oxide film on the isolation region are removed, so that polymer occurring from the photoresist is prevented to affect an etch process for forming the trench.

The etch process for forming the trench may be implemented in-situ with no time delay at the etch chamber by which the pad nitride film and the pad oxide film are removed, in order to prevent a native oxide film from being formed on the semiconductor substrate of the isolation region.

The etch process for forming the trench may include the steps of performing a first etch process for the semiconductor substrate only with a process condition having a high selectivity ratio to the protrusions to form the trench the top corners of which are not made rounded, and performing a second etch process, using a post etch treatment (PET) with a process condition having a low selectivity ratio to the protrusions, to form etch tilt faces at the top corners of the trench while removing the protrusions, thereby forming the trench that is made rounded. At this time, the etch selectivity ratio to the protrusions and the semiconductor substrate is controlled by adjusting the flux of an HBr gas among etch gases. In the first etch process, the semiconductor substrate only is etched by increasing the flux of the HBr gas. In the second etch process, the top corners of the trench along with the protrusions are etched by relatively reducing the flux of the HBr gas.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other features and advantages of the will be apparent from the following detailed description of the preferred embodiments of the invention in conjunction with the accompanying drawings, wherein.

DETAILED DESCRIPTION OF THE PREFERRED EMBODIMENT

Figure 1A:
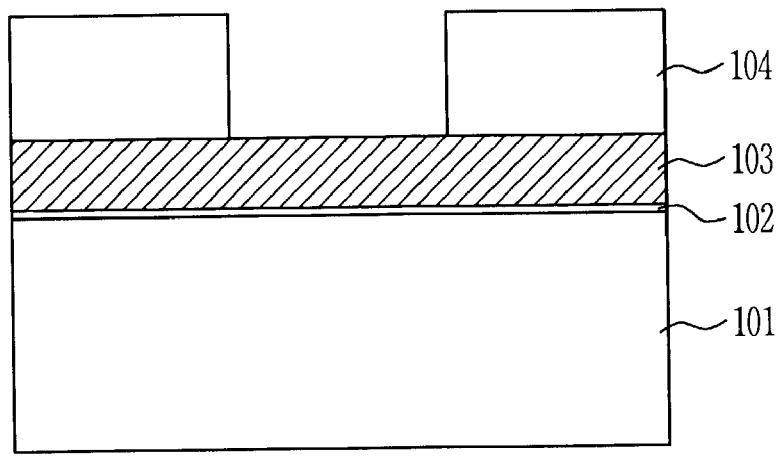
FIG. 1A~FIG. 1D are cross-sectional views of the semiconductor devices for explaining a conventional method of forming an isolation film in the semiconductor device.
Figure 1B:
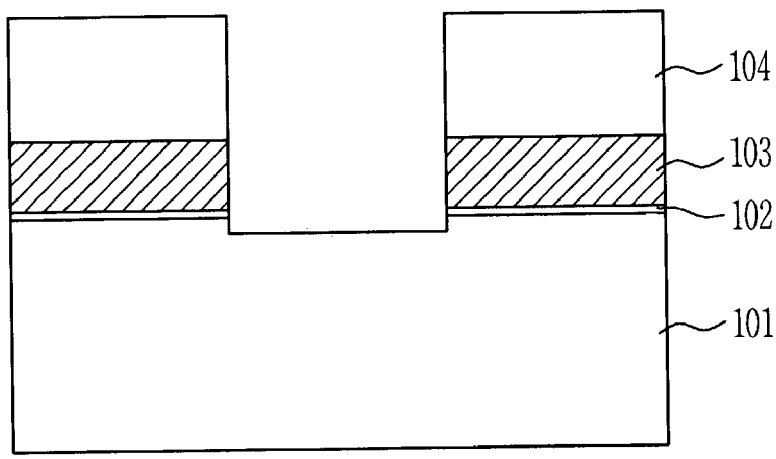
Figure 1C:
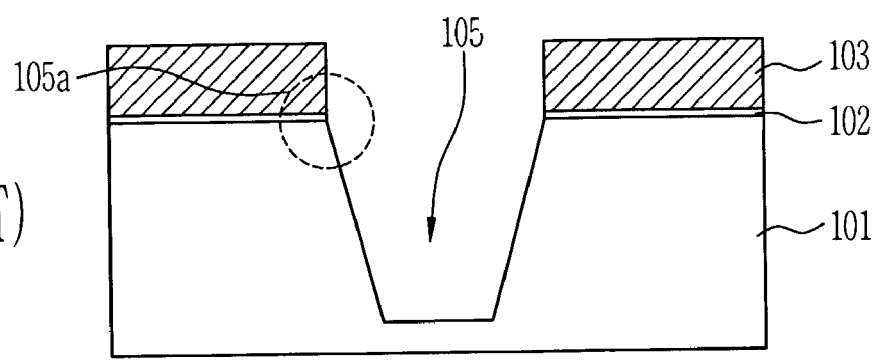
Figure 1D:
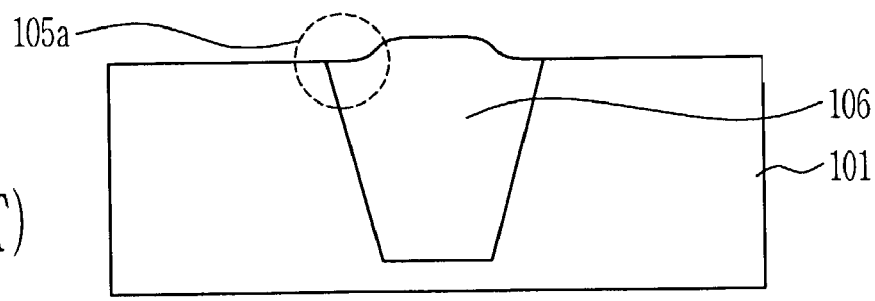

Reference will now be made in detail to the preferred embodiments, examples of which are illustrated in the accompanying drawings, in which like reference numerals are used to identify the same or similar parts.

FIG. 2A~FIG. 2E are cross-sectional views of the semiconductor devices for explaining a method of forming an isolation film in the semiconductor device a preferred embodiment of the present invention.

Figure 2A:
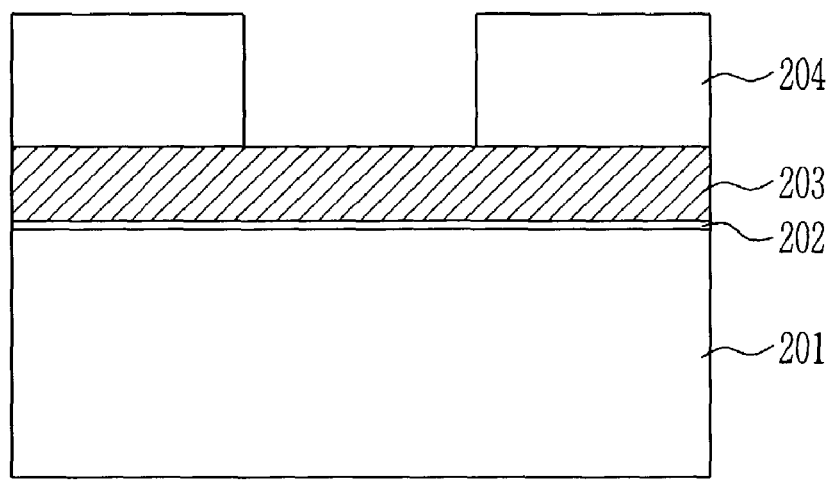
FIG. 2A~FIG. 2E are cross-sectional views of the semiconductor devices for explaining a disclosed method of forming an isolation film in the semiconductor device.

Referring to FIG. 2A, a pad oxide film 202 and a pad nitride film 203 are sequentially formed on a semiconductor substrate 201. A photoresist is then covered on the pad nitride film 203. Next, exposure and development processes are implemented to form photoresist patterns 204 in which an isolation region where an isolation film will be formed is defined. The pad nitride film 203 in the region where the isolation film is to be formed is thus exposed. At this time, it is preferred that the pad nitride film 203 is formed in thickness of below 1500□.

Figure 2B:
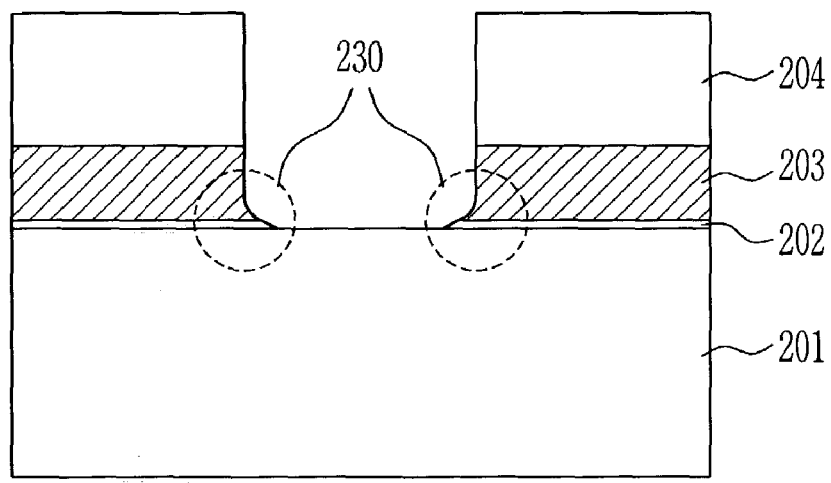

By reference to FIG. 2B, the pad nitride film 203 in the isolation region is removed through an etch process. The pad oxide film 202 exposed below the pad nitride film 203 is then removed, thereby exposing the semiconductor substrate 201 in the isolation region. At this time, in the process of removing the pad nitride film 203 and the pad oxide film 202 in the isolation region, protrusions 230 of a tail profile are formed at the bottom sidewalls of the pad nitride film 203 and the pad oxide film 202 coming into contact with the surface of the semiconductor substrate 201. At this time, the protrusions 230 serves as an anti-etch film that prevents the corners of the isolation region from being etched in a subsequent process of etching the semiconductor substrate 201 to form a trench.

Even though there are many methods for forming these protrusions 230, two embodiments as examples will be described.

As a first method, in the etch process of removing the pad nitride film 203 in the isolation region, the protrusions 230 may be formed by a method of controlling the process condition on the etch gas and over-etch. M ore concretely, during 1~10% of time taken to remove the pad nitride film 203 after the pad nitride film 203 in the isolation region is etched, over-etch is implemented using a $CHF_3$ gas. At this time, if the over-etch process is implemented using the $CHF_3$ gas, polymer occurs. As the over-etch process is performed in a short period of time, however, the protrusions 230 is formed while polymer is accumulated on the bottom sidewalls of the pad nitride film 203 and the pad oxide film 202.

As a second method, in the etch process of removing the pad nitride film 203 and the pad oxide film 202 in the isolation region, the protrusions 230 may be formed by controlling the etch selectivity ratio of the pad nitride film 203 and the pad oxide film 202. More concretely, the pad nitride film 203 is usually removed by means of an etch process using a $CF_4$ gas and a $CHF_3$ gas. Generally, the $CF_4$ gas is more supplied than the $CHF_3$ gas. If the $CHF_3$ gas is more supplied, however, the tail profile consisting of nitride/oxide are formed while the etch tilt faces are formed at the lower sidewalls of the pad oxide film 202. At this time, the $CHF_3$ gas and the $CF_4$ gas may be supplied at the ratio of 2:1~10:1. Meanwhile, in this case, when the pad nitride film 203 and the pad oxide film 202 are etched, a time point when a silicon component of the semiconductor substrate 201 is detected is not set as an end of point (EOP). Instead, a time point when an oxide component of the pad oxide film 202 is detected is set as EOP.

As in the above, if the pad nitride film 203 and the pad oxide film 202 in the isolation region are removed by means of the etch gas and the over etch process or by controlling the etch selectivity ratio of the pad nitride film 203 and the pad oxide film 202, the protrusions 230 of the tail profile is formed at the bottom sidewalls of the pad nitride film 203 and the pad oxide film 202.

Figure 2C:
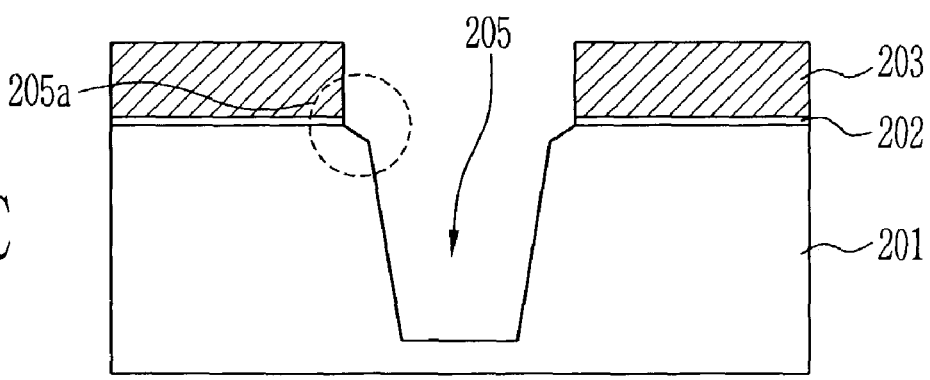

Referring to FIG. 2C, the photoresist pattern (204 in FIG. 2B) is removed. The semiconductor substrate 201 of the isolation region is then etched by a given depth to form a trench 205. At this time, as the protrusions (230 in FIG. 2B) formed at the top corners of the isolation region hinders the corners of the isolation region from being etched, etch tilt faces are formed at the top corners 205a of the trench 205. Due to this, the top corners 205a of the trench 205 is made rounded.

In the above, before the trench 205 is formed after the pad nitride film and the pad oxide film of the isolation region is removed, an etch process is usually implemented in order to remove a native oxide film formed on the surface of the exposed semiconductor substrate. However, if the etch process is performed in order to remove the native oxide film, the protrusions 230 may be damaged. Therefore, in order to prevent formation of the native oxide film from the beginning, the trench is formed in the isolation region in-situ with no time delay at the etch chamber by which the pad nitride film and the pad oxide film are removed. As thus, if the semiconductor substrate 201 is in-situ etched to form the trench, it is possible to omit the etch process for removing the native oxide film. Accordingly, there is an advantage that the process step is reduced.

Meanwhile, in the etch process for forming the trench 205, the etch process by which the top corners of the trench 205 is made rounded using the protrusions may be implemented in various methods. This will be below described in more detail.

As a first method, if the trench 205 is formed by means of the etch process of a common semiconductor substrate 201, the protrusions 230 are more slowly etched when the semiconductor substrate 201 is etched while the etch tilt faces are naturally formed at the corners of the isolation region, whereby the trench 205 that is rounded is formed.

Figure 3A:
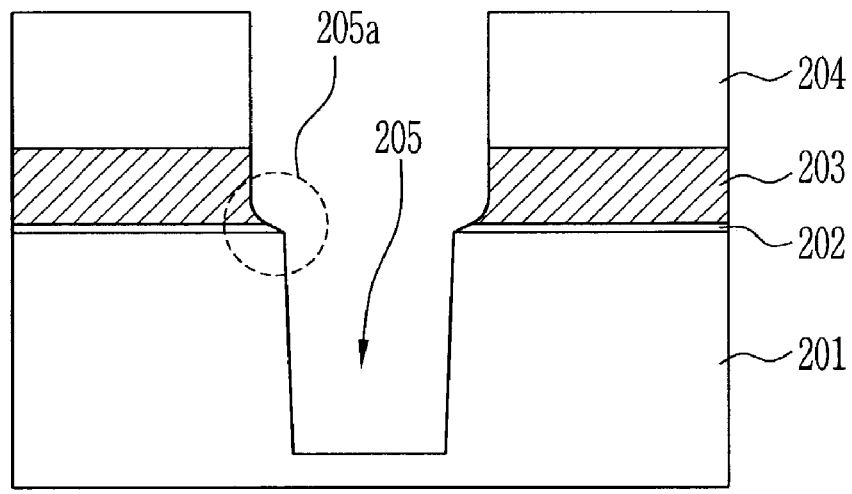
FIG. 3A and FIG. 3B are cross-sectional views of the semiconductor devices for explaining an embodiment of the etch process for forming the trench as shown in FIG. 2C.
Figure 3B:
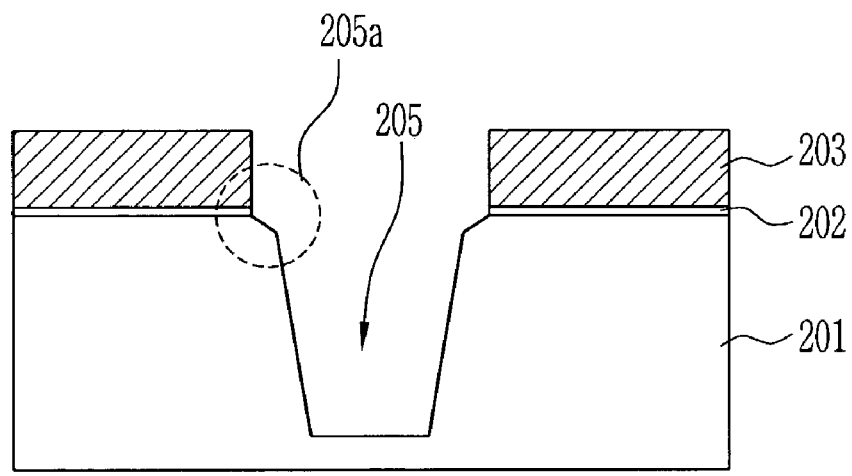

As a second method, the trench 205 the top corners of which are made rounded by twice etch processes may be formed by controlling the etch selectivity ratio to the protrusions 230 consisting of nitride and oxide and the semiconductor substrate 201. This will be described in more detail by reference to FIG. 3A and FIG. 3B. FIG. 3A and FIG. 3B are cross-sectional views of the semiconductor devices for explaining an embodiment of the etch process for forming the trench in FIG. 2C.

Referring to FIG. 3A, in a state that the protrusions 230 consisting of nitride and oxide are formed at the bottom sidewalls of the pad nitride film 203 and the pad oxide film 202, only the semiconductor substrate 201 is etched using a process condition having a high selectivity ratio to the protrusions 230, thus forming the trench 205 the top corners 205a of which are not rounded.

By reference to FIG. 3B, the etch tilt faces are formed at the top corners 205a of the trench 205 to form the trench 205 that is made rounded, while removing, the protrusions (230 in FIG. 3A), by implementing a PET (post etch treatment) process with a process condition having a low selectivity ratio to the protrusions 230. At this time, the etch selectivity ratio to the protrusions (230 in FIG. 3A) and the semiconductor substrate 201 could be controlled by adjusting the flux of the HBr gas only among the etch gases. In other words, in a first etch process, the semiconductor substrate 201 only is-etched by increasing the flux of the HBr gas. In a second etch process, the top corners 205a of the trench 205 along with the protrusions (230 in FIG. 3A) are etched by relatively reducing the flux of the HBr gas.

At this time, one of the most important characteristics the trench is formed by the above method, is as follows. As the trench is formed with the photoresist pattern removed, the trench is not affected by polymer occurring from the photoresist. Therefore, the etch process could be more accurately controlled and reliability of the process can be thus improved.

Figure 2D:
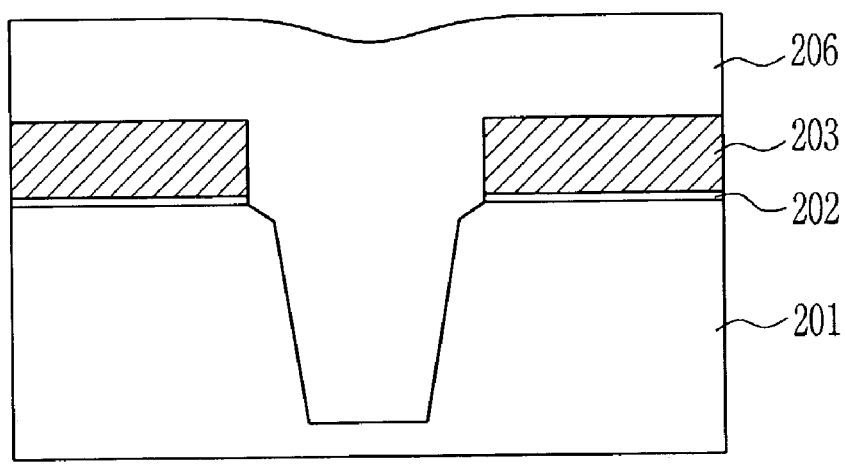

Referring to FIG. 2D, an insulating material layer 206 is formed on the entire structure so that the trench 205 is buried.

Figure 2E:
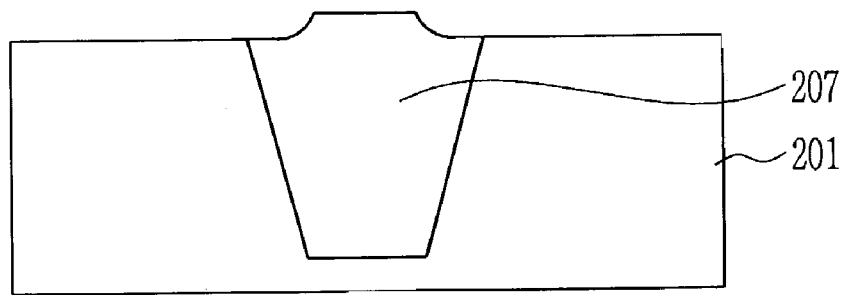

By reference to FIG. 2E, the insulating material layer (206 in FIG. 2D) on the pad nitride film (203 in FIG. 2D) is removed by means of a chemical mechanical polishing process. The pad nitride film and the pad oxide film (202 in FIG. 2D) are then sequentially removed by means of an etch process. Thereby, the insulating material layer remains only at the trench (205 in FIG. 2D) the top corners of which are made rounded, thus forming the isolation film 207 consisting of the insulating material layer.

As described above, when the isolation film of the STI structure is formed using the above method, the present invention has the following advantageous effects.

First, as the protrusions are formed by adjusting time taken to implement the over-etch process or the mixed ratio of the etch gas when they are formed, the profile of the protrusions could be exactly controlled. Accordingly, as the top corners of the trench could be uniformly made rounded, reliability of the process is improved.

Second, the trench is formed by in-situ etching the semiconductor substrate with no time delay in the etch chamber by which the pad nitride film and the pad oxide film are removed. It is thus possible to prevent formation of the native oxide film. Accordingly, it is possible to omit a cleaning process for removing the native oxide film and thus to reduce the process step and time.

Third, as the top corners of the trench are formed to be round, concentration of an electric field is prevented. Accordingly, it is possible to prevent variation in the threshold voltage of the semiconductor device such as the transistor.

Fourth, as the top corners of the trench are formed to be round, concentration of an electric field is prevented. Accordingly, it is possible to generation of dislocation of silicon.

Fifth, as the top corners of the trench are formed to be round, it is possible to prevent the gate oxide film from being thinly formed in a subsequent process. Accordingly, it is possible to prohibit an increase in the leakage current.

Sixth, as the top corner of the trench could be formed to be round even with the photoresist pattern removed, existing problems in the process that made difficult to remove the photoresist pattern and to make rounded the top corners of the trench could be solved.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of forming an isolation film in a semiconductor device comprising:
   sequentially forming a pad oxide film and a pad nitride film on a semiconductor substrate;
   removing the pad nitride film and the pad oxide film in an isolation region so that tapered, inwardly extending protrusions of a tail profile are formed from the pad nitride and pad oxide films at top corners of the isolation region;
   etching the semiconductor substrate in the isolation region, while using the protrusions of the pad nitride and pad oxide films as an anti-etch film, to form a trench the top corners of which are made rounded; and
   filling the trench with an insulating material and then removing remaining portions of the pad nitride film and the pad oxide film on the semiconductor substrate to form an isolation film.

2. The method as claimed in claim 1, wherein the protrusions are formed by implementing an over-etch process using a $CHF_3$ gas during 1~10% of time taken to remove the pad nitride film after the pad nitride film in the isolation region is removed.

3. The method as claimed in claim 1, wherein the protrusions are formed by implementing an etch process with a high selectivity ratio to oxide in the etch process for removing the pad nitride film and the pad oxide film.

4. The method as claimed in claim 3, wherein the etch process is implemented using a $CF_4$ gas and a $CHF_3$ gas as an etch gas and wherein the $CHF_3$ gas is more supplied than the $CF_4$ gas so that the selectivity ratio to oxide is increased.

5. The method as claimed in claim 4, wherein the supply ratio of the $CHF_3$ gas and the $CF_4$ gas is 2:1~10:1.

6. The method as claimed in claim 3, wherein the etch process is implementing by setting a time point when an oxide component of the pad oxide film is detected as an end of point (EOP).

7. The method as claimed in claim 1, wherein a photoresist pattern is formed on the pad nitride film in order to define the isolation region, and wherein the photoresist pattern is removed before the trench is formed after the pad nitride film and the pad oxide film on the isolation region are removed, so that polymer occurring from the photoresist is prevented to affect an etch process for forming the trench.

8. The method as claimed in claim 1, wherein the etch process for forming the trench is implemented in-situ with no time delay at the etch chamber by which the pad nitride film and the pad oxide film are removed, in order to prevent a native oxide film from being formed on the semiconductor substrate of the isolation region.

9. The method as claimed in claim 1, wherein the etch process for forming the trench includes the steps of:
   performing a first etch process for the semiconductor substrate only with a process condition having a high selectivity ratio to the protrusions to form the trench the top corners of which are not made rounded; and
   performing a second etch process, using a post etch treatment (PET) with a process condition having a low selectivity ratio to the protrusions, to form etch tilt faces at the top corners of the trench while removing the protrusions, thereby forming the trench that is made rounded.

10. The method as claimed in claim 9, wherein the etch selectivity ratio to the protrusions and the semiconductor substrate is controlled by adjusting the flux of an HBr gas among etch gases.

11. The method as claimed in claim 9, wherein in the first etch process, the semiconductor substrate only is etched by increasing the flux of the HBr gas and in the second etch process, the top corners of the trench along with the protrusions are etched by relatively reducing the flux of the HBr gas.

* * * * *

UNITED STATES PATENT AND TRADEMARK OFFICE
CERTIFICATE OF CORRECTION

PATENT NO.         : 7,018,931 B2                                           Page 1 of 1
APPLICATION NO. : 10/631238
DATED                : March 28, 2006
INVENTOR(S)        : Sung Hoon Lee It is certified that error appears in the above-identified patent and that said Letters Patent is hereby corrected as shown below:

On the title Page:

At item (57), line 9, "etched, Therefore," should be -- etched. Therefore, --.

In the Claims:

At Column 8, line 2, "implementing" should be -- implemented --.

Signed and Sealed this

Eleventh Day of September, 2007

JON W. DUDAS
*Director of the United States Patent and Trademark Office*